US007850836B2

(12) United States Patent
Dixit et al.

(10) Patent No.: US 7,850,836 B2
(45) Date of Patent: Dec. 14, 2010

(54) METHOD OF ELECTRO-DEPOSITING A CONDUCTIVE MATERIAL IN AT LEAST ONE THROUGH-HOLE VIA OF A SEMICONDUCTOR SUBSTRATE

(75) Inventors: Pradeep Dixit, Singapore (SG); Jianmin Miao, Singapore (SG)

(73) Assignee: Nanyang Technological University, Singapore (SG)

( * ) Notice: Subject to any disclaimer, the term of this patent is extended or adjusted under 35 U.S.C. 154(b) by 723 days.

(21) Appl. No.: 11/595,627

(22) Filed: Nov. 9, 2006

(65) Prior Publication Data
US 2007/0202686 A1 Aug. 30, 2007

Related U.S. Application Data

(60) Provisional application No. 60/735,050, filed on Nov. 9, 2005.

(51) Int. Cl.
*C25D 5/00* (2006.01)
*C25D 21/12* (2006.01)
*C25D 5/18* (2006.01)
*C25D 5/02* (2006.01)
*H01L 21/288* (2006.01)

(52) U.S. Cl. .................. 205/84; 205/81; 205/103; 205/105; 205/107; 205/123; 205/125

(58) Field of Classification Search .................. 205/105, 205/107, 123, 125, 81, 84, 103
See application file for complete search history.

(56) References Cited

U.S. PATENT DOCUMENTS 4,830,987 A * 5/1989 Miller et al. .............. 438/796

| 5,972,192 | A   | * | 10/1999 | Dubin et al. ............. 205/101 |
| 6,340,633 | B1  |   | 1/2002  | Lopatin et al. |
| 2002/0022318 | A1 | * | 2/2002 | Choi ........................ 438/253 |
| 2003/0019755 | A1 | * | 1/2003 | Hey et al. .................. 205/87 |
| 2003/0221967 | A1 | * | 12/2003 | Tsuchida et al. .......... 205/103 |

FOREIGN PATENT DOCUMENTS

EP 0251347 A1 * 7/1988

OTHER PUBLICATIONS

Lin, C. J., et al., "High Density and Through-Wafer Copper Interconnects and Solder Bumps for MEMS Wafer-Level Packaging", Microsystem Technologies, 10, 517-521 (2004).

(Continued)

*Primary Examiner*—Kaj K Olsen
*Assistant Examiner*—Susan Thai
(74) *Attorney, Agent, or Firm*—K. David Crockett, Esq.; Niky Economy Syrengelas, Esq.; Crockett & Crockett

(57) ABSTRACT

An initial pulse current cycle is supplied to at least one through-hole via. The pulse current cycle includes a forward pulse current. The magnitude of the forward pulse current is lower than the magnitude of the reverse pulse current. A corresponding forward and reverse current density is generated across the via causing conductive material to be deposited within the via, thereby reducing the effective aspect ratio of the via. At least one subsequent pulse current cycle is supplied. The magnitudes of the forward and reverse pulse currents of the subsequent pulse current cycle are determined in relation to the reduced effective aspect ratio. A subsequent corresponding forward and reverse current density is generated across the through-hole via causing conductive material to be deposited within the via, thereby further reducing the effective aspect ratio of the via.

15 Claims, 13 Drawing Sheets

OTHER PUBLICATIONS

Seong, J. O., et al., "High Density, High Aspect Ratio Through-Wafer Electrical Interconnect Vias for MEMS Packaging", IEEE Transactions on Advanced Packaging, IEEE Transactions on Advanced Packaging, 26, 302-309 (2003).

Kutchoukov, V. G., et al., "Through-Wafer Interconnect Technology for Silicon", Journal of Micromechanics and Microengineering, 14, 1029-1036 (2004).

Nguyen, N. T., et al., "Through-Wafer Copper Electroplating for Three-Dimensional Interconnects", Journal of Micromechanics and Microengineering, 12, 395-399 (2002).

Chow, Eugene M., et al., "Process Compatible Polysilicon-Based Electrical Through-Wafer Interconnects in Silicon Substrates" Journal of Microelectromechanical systems, 11, 631-640 (2002).

Christensen, Carsten., et al. "Wafer Through-Hole Interconnections with High Vertical Wiring Densities", IEEE Transaction on Components, Packaging and Manufacturing Technology- Part A, 19, 516-522 (1996).

Hyongsok, T. Soh., et al., "Ultra-Low Resistance, Through-Wafer Via (TWV) Technology and Its Applications in Three Dimensional Structures on Silicon", Japanese Journal of Applied Physics, 38, 2393-2396 (1999).

Burkett, S.L., et al., "Advanced Processing Techniques for Through-Wafer Interconnects," 22 J. Vacuum Science and Tech. B, 248-256 (2004).

Jian-Jun, Sun, et al., "High-Aspect-Ratio Copper Vla Filling Used for Three Dimensional Chip Stacking", Journal of the Electrochemical Society, 150 (6), G355-G358 (2003).

* cited by examiner (A)

(B)

(A)

(B)

METHOD OF ELECTRO-DEPOSITING A CONDUCTIVE MATERIAL IN AT LEAST ONE THROUGH-HOLE VIA OF A SEMICONDUCTOR SUBSTRATE

CROSS-REFERENCE TO RELATED APPLICATION

The present application claims the benefit of U.S. provisional application 60/735,050, "Aspect ratio dependent electroplating process for the fabrication of high aspect ratio copper interconnects", filed on Nov. 9, 2005, the entire contents of which is incorporated herein by reference for all purposes.

TECHNICAL FIELD

The present invention relates to the field of electro-deposition of conductive materials on semi-conductors, and more particularly, to a method of electro-depositing a conductive material in at least one through-hole via of a semiconductor substrate, said through-hole via having an effective aspect ratio.

BACKGROUND

In the last decade, electroplating has emerged as a key technology in the fabrication of the next generation of electronic devices. In this respect, the next generation of electronic devices is required to be lighter, have a larger processing capacity and to possess a higher degree of functionality than present devices. In order to achieve this, electronic devices have begun to utilize a technique known as 3-D wafer stacking in which several individual devices (or wafers and metal layers) are stacked together, and vertically interconnected to each other by conducting posts that are formed within through-hole vias of said devices. The conducting posts are typically electroplated into the through-hole vias.

Vertical interconnection between individual devices is preferred as the vertical axis offers the shortest possible electrical interconnect length. Accordingly, vertical interconnection results in lower parasitic losses, RC delay and thus, gives rise to faster response times.

An example of a material favored for forming said vertical interconnects is Copper (Cu), due to its high electrical conductivity and high electromigration resistance. Copper is typically deposited by an electroplating process. This process allows for the deposition of a layer several hundred microns thick. An advantage of electrodeposition, as compared to other physical deposition processes like sputtering, e-beam evaporation and chemical vapor deposition (CVD), is that the electroplating process is cheaper, faster and requires a lower temperature, comparatively.

Although electroplating of metals such as copper or nickel is a well established process and its principles are generally well known, complete void free filling of through-holes is still a challenging task. U.S. Pat. No. 6,340,633 attempts to address the problem by utilizing a method of electroplating copper in a via in a thin layer wherein a reverse pulse current density is supplied and ramped, i.e. the forward pulse current density increases over each successive pulse while the reverse pulse current density is kept constant. As the forward current density increases, the grain size of the copper deposited in the via also increases. Accordingly, the method disclosed here intends for an initial low forward pulse current density to be applied, followed by increasing forward pulse current densities in order that copper of a small grain size fills the bottom of the via initially, while copper of a larger grain size fills the higher portions of said via, as the interconnect is built up.

For high aspect ratio through-holes, the inventors in this patent application have found that the incomplete filling of a through-hole via, and void formation therein, lies firstly, in the high aspect ratio of the via itself, and secondly, due to the insufficient wetting of the side walls of the through-hole vias with copper electrolyte. For the first reason, high aspect ratio (where value of the aspect ratio is greater than 10) vias undergoing electroplating have an uneven local current density that results in an uneven distribution of copper being deposited. Typically, the current density is higher at each corner point inside the through-holes and lower along the vias. In high aspect ratio through-hole vias, the current density does not remain uniform along the depth during the electroplating process. The current density at the entry and exit of said via, is typically higher than that at the center. Due to higher current density at the corners, the copper deposition rate at the corners is greater than at the center of the vias. As a result of this uneven deposition of copper, the entrance of the vias eventually becomes blocked at the top and the bottom thereby forming a void in the center.

As for the second reason, in high aspect ratio through-holes, the electrolyte does not wet the via sidewall surface completely and in some cases, said electrolyte even does not reach the bottom of the via. This problem is further compounded due to the present use of deep reactive ion etching (DRIE) to etch through-holes in silicon substrates. During the passivation step of the DRIE process, a thin layer of polymer is deposited on the side walls to protect it from lateral etching. This polymer (Poly-tetra-fluoro compound) is a hydrophobic material, which prevents the wetting of the via surface with copper electrolyte. Due to insufficient interaction between the copper electrolyte and some local points on the via surface, again, the current density distribution, as mentioned above, varies, which results in non-uniform copper deposition along the through-via surface.

As such, there is a need for a method of electro-depositing conductive material in through-hole vias having a high aspect ratio that results in the formation of void free interconnects, is compatible with existing fabrication technology and is cost-effective as well.

SUMMARY

A first aspect of the present invention relates to a method of electro-depositing a conductive material in at least one through-hole via of a semiconductor substrate, said through-hole via having an effective aspect ratio. The method includes supplying an initial pulse current cycle to the via, said pulse current cycle having a forward pulse current, and a reverse pulse current, wherein the forward pulse current and the reverse pulse current are each of a predetermined distinct magnitude and are each supplied over a predetermined distinct period. The magnitude of the forward pulse current is lower than the magnitude of the reverse pulse current, such that a corresponding forward and reverse pulse current density is generated across the via causing conductive material to be deposited within the via, thereby reducing the effective aspect ratio of said via. The method also includes supplying at least one subsequent pulse current cycle wherein the magnitude of the forward and reverse pulse currents of the subsequent pulse current cycle are determined in relation to the reduced effective aspect ratio resulting from a previous pulse current cycle, such that a subsequent corresponding forward and reverse pulse current density is generated across the through-hole via causing conductive material to be deposited within the via, thereby further reducing the effective aspect ratio of said via with each subsequent pulse current cycle until the through-hole via is completely filled with conductive material.

A second aspect of the present invention is a wafer holder device for holding a support wafer having a circular device wafer mounted thereon during the electro-deposition of a conductive material into at least one through-hole via of said device wafer, said device wafer being of a smaller diameter than its support wafer and mounted on said support wafer in a concentric arrangement leaving an open ring portion surrounding said device wafer. The wafer holder device includes a bottom portion having a recess adapted to accommodate therein the support wafer such that the support wafer contacts the bottom and occupies the recess with the device wafer protruding from the opening of said recess, said bottom portion being in electrical connection with an electrical source. The device also includes a conducting annular contact ring mounted to overlap the bottom portion partially and the open ring portion of the support wafer partially, such that the annular ring surrounds and contacts the circumferential periphery of the device wafer. The device further includes an upper portion adapted to be mounted on said bottom portion such that it sandwiches therebetween said annular ring and support wafer, thereby ensuring an electrical connection between said electrical source and the device wafer via the bottom portion, annular ring and support wafer.

A third aspect of the present invention relates to a method for preparing a device wafer for electro-deposition using a wafer holder device as described above, wherein the diameter of the circular device wafer is less than the diameter of the support wafer. The method includes coating the support wafer with an adhesion and a seed layer; etching holes of a predetermined depth in the device wafer; bonding the device wafer to the support wafer in a concentric arrangement; and mounting the support wafer, with the device wafer bonded thereto, in the recess of the bottom portion of the wafer holder device and securing the device wafer in position.

DETAILED DESCRIPTION AND EXEMPLARY EMBODIMENTS

Figure 1:
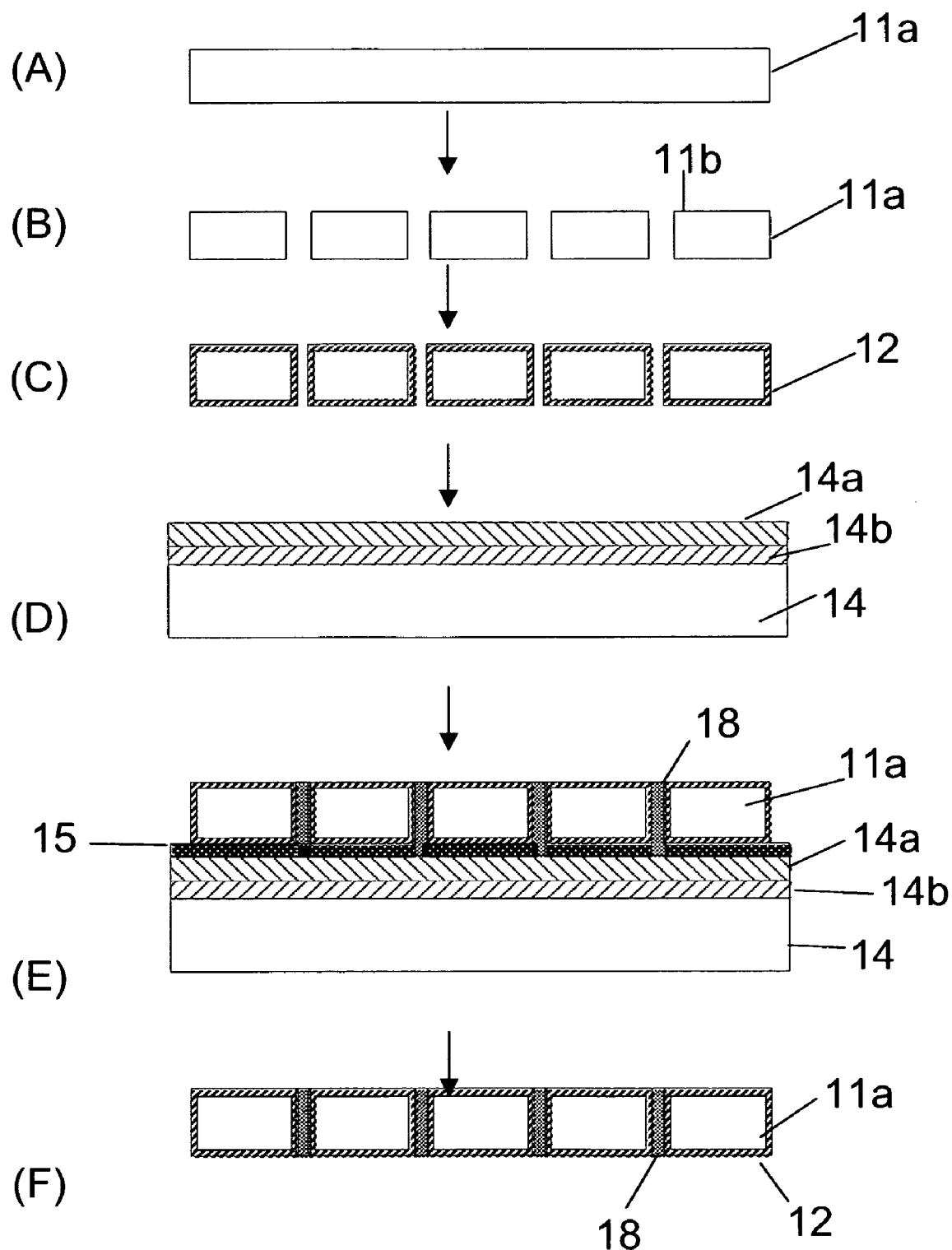
FIG. 1 is an illustration of a schematic process flow diagram showing the fabrication of through-wafer interconnects by electroplating.

FIG. 1 is an illustration of a schematic process flow diagram showing the fabrication of through-hole wafer interconnects by electroplating. In step (A), device wafer 11a may be any suitable semi-conductor wafer. In this respect, typically, silicon (Si) wafers are used. Prior to the electroplating process, the device wafer 11a is usually first prepared by rinsing in Piranha solution [prepared by mixing 96% $H_2SO_4$ and 30% $H_2O_2$ in the ratio 3:1 (volumetric)] at 120° C. This is followed by the fabrication of though-hole vias 11b in the wafer 11a in order to use a 'bottom-up' electroplating technique.

Figure 2:
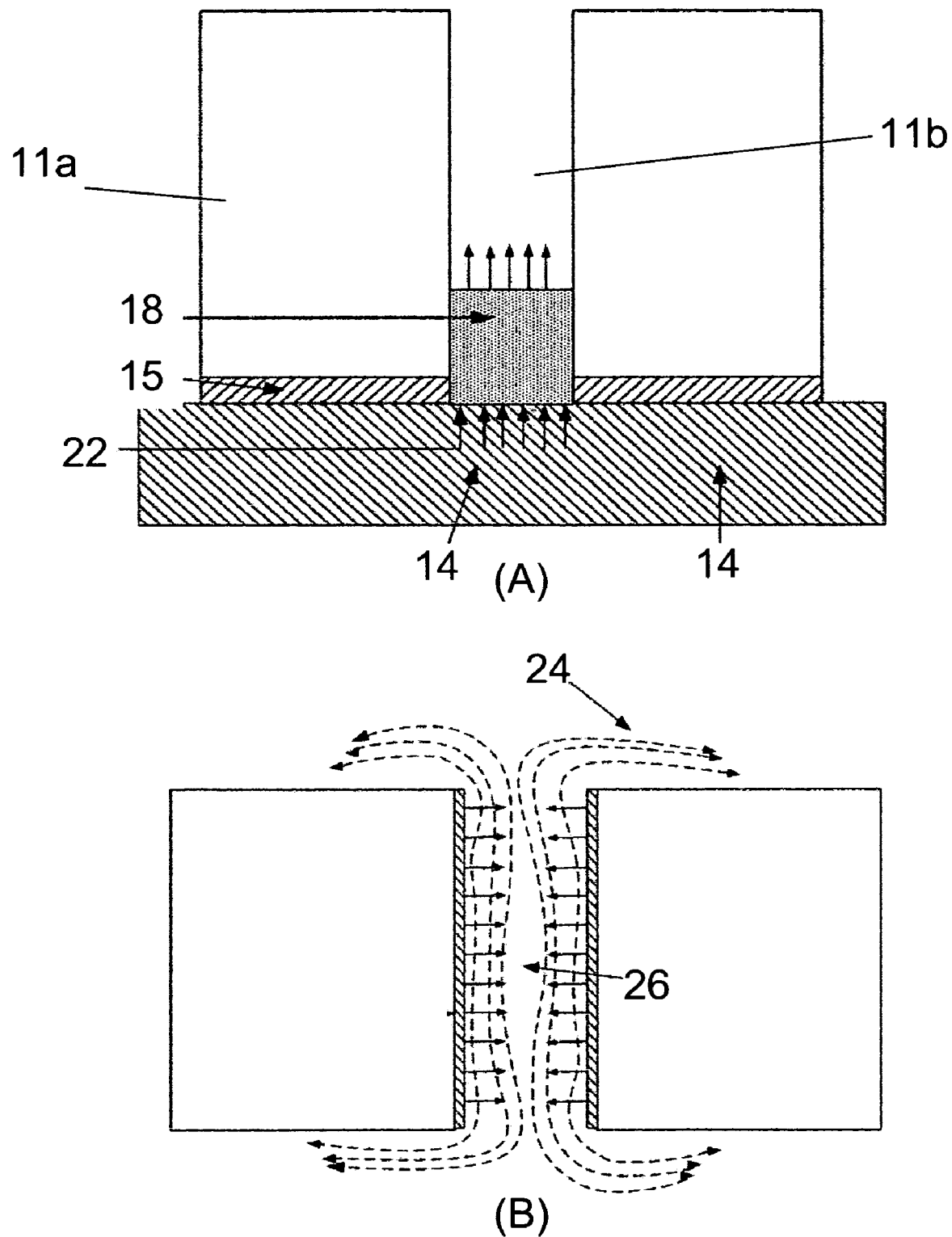
FIG. 2A is an illustration of the concept of 'bottom up' electroplating.
FIG. 2B is an illustration of conventional electroplating that has an uneven current distribution across a through-hole via at its top and center.

Bottom-up electroplating approach utilizes two wafers that are termed as device wafer 11a and a support or contact wafer 14. FIG. 2A illustrates the concept of bottom-up plating. In FIG. 2A, support wafer 14 is bonded to a device wafer 11a via a photoresist layer 15. Details of the preparation of the support wafer for the electroplating process follow later in (D) of FIG. 1. Essentially, a current density 22 is generated across the via 11b such that the conducting material (copper) 18 is deposited at the bottom of the via 11b first and with each subsequent deposition, the interconnect within the via 11b is gradually built up from the bottom, hence the term 'bottom-up'.

Referring back to FIG. 1, the through holes vias 11b are created using a DRIE process as is commonly known in the state of art. An example of one such DRIE process is the DRIE-BOSCH process. Using the DRIE process, vias 11b having varying dimensions from about 20 μm to about 40 μm are etched in the device wafer 11a to form vias 11b as shown in (B). Subsequently, in (C), a thin layer of silicon dioxide ($SiO_2$) and silicon nitride ($Si_3N_4$) 12 are deposited on device wafer 11a, and within the through-hole vias 11b.

At this juncture, an optional step of carrying out surface treatment of the DRIE etched through-hole vias 11b may be carried out. The optional step of carrying out surface treatment of the coated surface of the through-hole via aims to increase the hydrophilicity thereof. The surface treatment may be carried out by any suitable method such as applying a surface treatment solution or by plasma etching, for example.

Where the surface treatment is by the application of a surface treatment solution, the surface treatment solution may be an oxidizing solution containing hydrogen peroxide or hypochloride or other suitable oxidizing agents. An illustrative example of an oxidizing solution is standard clean 1 (SC1) solution (30% $H_2O_2$, 25% $NH_4OH$ and de-ionized water in a 1:1:5 ratio) which, for example, can be applied to the respective surface to be treated for 30 minutes at a temperature of 75° C. The application of such oxidizing solution such as SC1 solution is typically followed by a rinsing with de-ionized (DI) water; and a drying of the treated surface in nitrogen.

cleaning the device wafer 11a in standard clean 1 (SC1) solution (30% $H_2O_2$, 25% $NH_4OH$ and de-ionized water in a 1:1:5 ratio) at 75° C. for 30 minutes, followed by rinsing with de-ionized water and drying of said device wafer 11a in nitrogen. This step may be carried out in order to enhance the wetting characteristics of the surface of the vias 11b with copper electrolyte, i.e. to improve or increase the hydrophilic nature of the surface of the vias 11b. Further details of this optional step are discussed in detail later on.

At (D) of FIG. 1 turns to the preparation of the support or contact wafer 14. As shown in (D), the contact wafer 14 includes two layers thereon, usually deposited by sputtering processes. The top layer is typically known as a seed layer 14a and is usually gold due to its superior conducting qualities. Apart from gold, other exemplary materials that may be used include, but are not limited to, copper, silver and nickel to form the seed layer 14a. However, as the conducting material used to form said seed layer 14a typically does not adhere well to the support wafer 14, which is usually silicon, an adhesive layer 14b (intermediate layer between the device wafer and the seed layer), such as chromium (Cr), for example, may be used. Following the preparation of the support wafer 14, the device wafer 11a is bonded temporarily to the support wafer 14 using a photoresist layer 15. After bonding, any photoresist layer 15 exposed at the bottom of the through-hole vias 11b is washed away leaving the seed layer exposed at said bottom of the via 11b.

Next, at (E) is the electro-deposition of a conducting material into the vias 11b. The method utilized for the electro-deposition of a conducting material, as mentioned above, is based on the bottom-up approach. The method used to implement the bottom-up approach, as described above, relies on an 'effective aspect' ratio (EAR) of a through-hole via 11b in determining the magnitude of a pulse current (forward and reverse) to be applied to the through-hole vias during the electroplating process. Essentially, the EAR considers the unfilled depth of the through-holes as the main criteria in determining the electroplating current parameters. The EAR is defined as the ratio of the unfilled depth of the through-hole via to the opening size of through-via.

Figure 3:
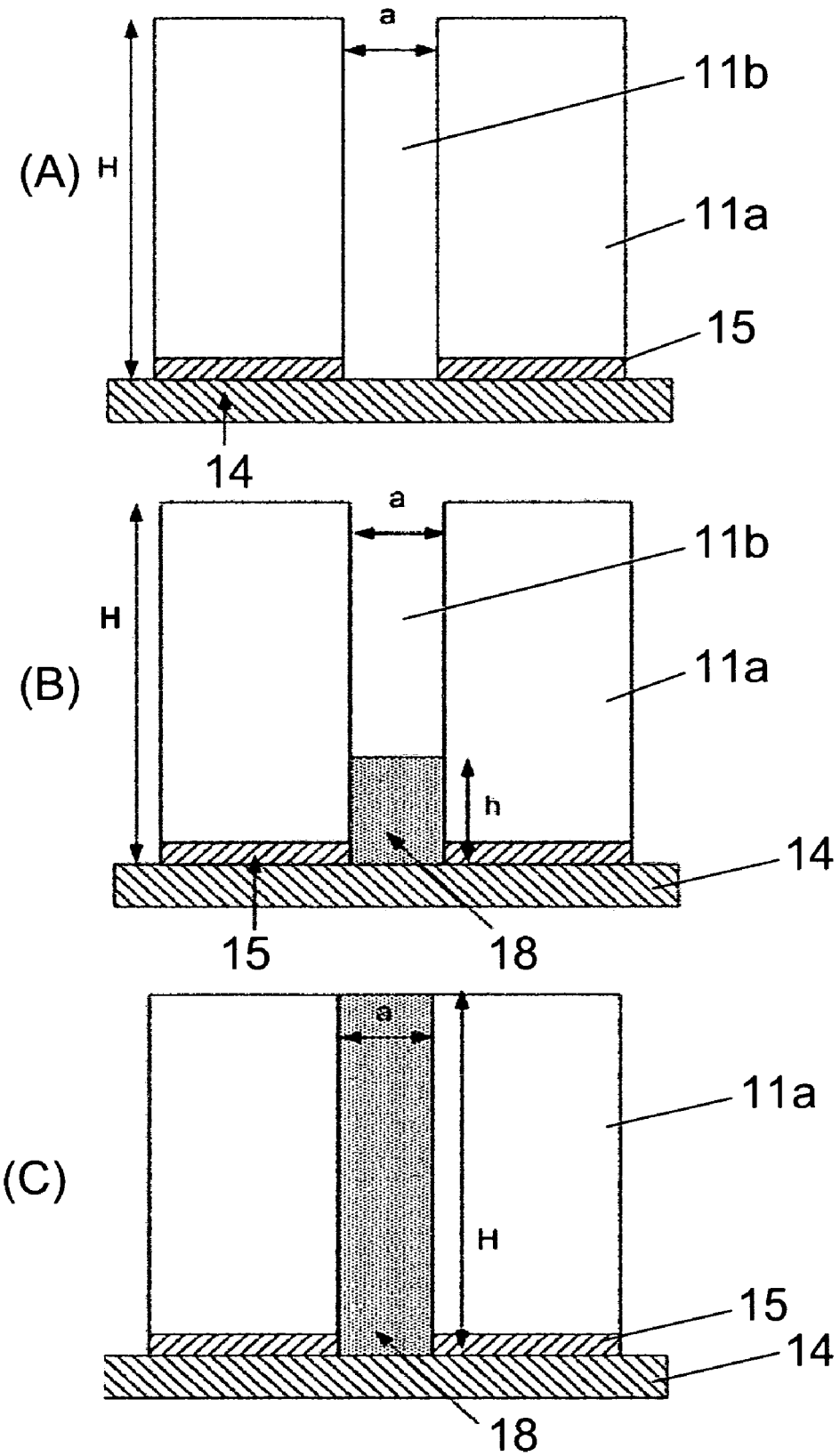
FIG. 3A-3C are illustrations showing a basic representation of 'effective aspect ratio'.

FIGS. 3A-3C further illustrate the concept of what EAR is. In FIG. 3A, prior to the start of the electroplating process (time t=0), the EAR is the same as the aspect ration (AR) and is given by H/a, where 'H' is the height of the unfilled via and 'a' is the diameter of said via. When the electroplating process (FIG. 3B) starts, metal ions begin to deposit on the bottom of the through-hole via 11b. As a result of continuous metal deposition, unfilled depth of the via is continuously decreasing with time. Thus, the AR of the unfilled vias or the EAR also continuously reduces with time. In FIG. 3B, the unfilled height is given by (H−h) after time t. Hence the EAR is reduced from H/a, at time t=0, to (H−h)/a, at t=т. The EAR will continuously decrease till the end of electroplating process.

The value of 'H' is usually known from the onset as that is the depth to which the through-holes have been etched to. The unfilled depth '(H−h)' may be determined by direct measurement using any suitable method. The unfilled height (H−h) may be measured directly by carried out using depth-light recorders that rely on the variations in light and the corresponding variation in its frequency and wavelength as the depth of the via changes or through the use of depth-dependent variations of acoustic measurements, for example. The value of 'h' can then be obtained, indirectly, by subtracting the depth of the unfilled height (H−h) from the height of the via H. The value of '(H−h)' or 'h' may be measured continuously (real-time) or periodically through-out the electroplating process by using the above-mentioned methods.

Accordingly, the method that implements the bottom-up approach, and relies on the aforesaid concept of a continuously decreasing EAR, includes supplying an initial pulse current cycle to the via 11b. The pulse current cycle includes a forward pulse current, and a reverse pulse current, wherein the forward pulse current and the reverse pulse current are each of a predetermined distinct magnitude and are each supplied over a predetermined distinct period. The magnitude of the forward pulse current in the initial pulse current cycle is lower than the magnitude of the reverse pulse current. This causes a corresponding forward and reverse current density to be generated across the via 11b which in turn causes conductive material (copper, for example) to be deposited within the via, thereby reducing the EAR of said via 11b.

After the initial pulse cycle is supplied, the EAR of the via, as previously described, continually changes as the interconnect is gradually formed. This causes the interelectrode gap (between the anode and the cathode) to reduce. This reduction in the interelectrode gap affects the electrolyte kinetics and cupric ion mass transfer from the electrolyte to the surface of the via 11b. Current distributions within the via, which depend upon the interelectrode gap, also vary accordingly. In this respect, the current distribution increases when the interelectrode gap reduces.

As a result of the reduction in the EAR, the current distributions inside the deep through-hole become non-uniform. This non-uniformity in current distribution and mass transfer of cupric ion affects the copper deposition and results in void formation, incomplete filling, rough grain formations and other undesired results. An example of such non-uniform current distribution is shown in FIG. 2B. The current distribution 24 is uneven and does not flow through the central region of the via 26. As such, in the present case, the changing EAR has not been taken into consideration and thus, the non-uniform current distribution 24 gives rise to the formation of voids in the region 26, as is the problem with conventional electroplating techniques.

In order to maintain a uniform current distribution when the distance between anode and deposited metal is continuously reducing (due to the decreasing EAR), process parameters such as current density and pulse on time, should be varied as the EAR varies. As such, in the present method, the electroplating parameters, such as forward current density and reverse current density (and if required, the pulse 'on' and 'off' time) should be varied continuously according to the continuous variation of the EAR.

Accordingly, in the present method, the initial pulse current cycle is followed by the supply of at least one subsequent pulse current cycle. The magnitude of the forward and reverse pulse currents of the subsequent pulse current cycle are determined in relation to the reduced effective aspect ratio resulting from a previous pulse current cycle (or from the initial pulse cycle as the case may be). In doing so, a subsequent corresponding forward and reverse current density (based on the ever-changing EAR) is generated across the through-hole via 11b. This causes conductive material to be deposited within the via at a deposition rate suited towards the changing unfilled depth of the via. Accordingly, the EAR of said via is reduced with each subsequent pulse current cycle as the via is gradually filled. The subsequent pulse cycles are repeated until the through-hole via is completely filled with conductive material, as in step (E) of FIG. 1. Once the via is completely filled, the support wafer 14 is removed leaving the device wafer 11a, with the through-hole vias 11b now filled with conductive material 18, such as copper, to form said interconnects as illustrated in step (F) of FIG. 1.

Figure 4:
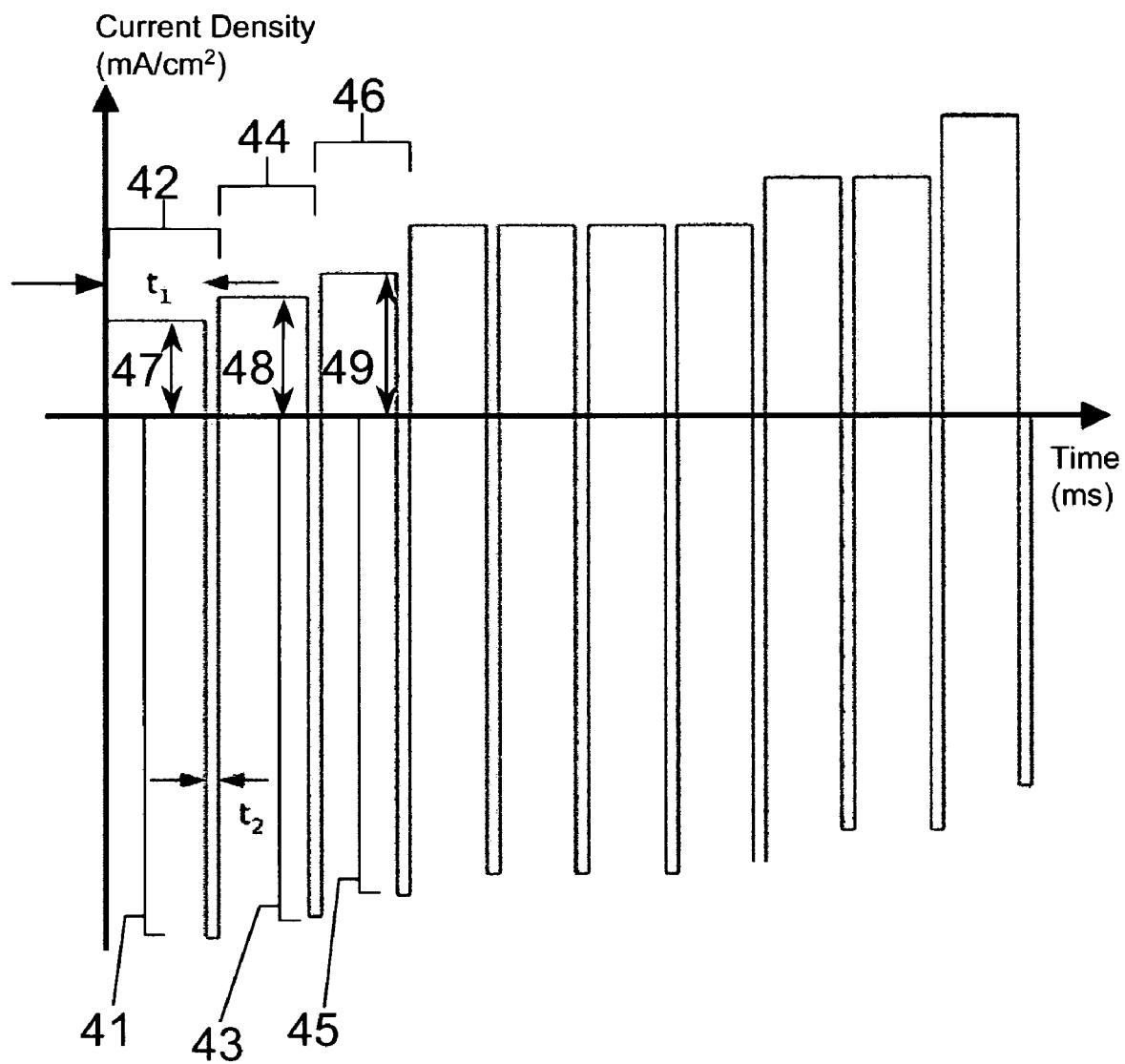
FIG. 4 is a graph of the variation of current density over time during 'aspect ratio dependent electroplating' using reverse pulse electroplating.

FIG. 4 is an illustration of a waveform of current density generated across a via over time during the electrodeposition step (E) of FIG. 1 according to the present method. During pulse on time ($t_1$), current of low magnitude 47 flows in a forward direction and fine grain copper is deposited on the bottom of the through-holes. A low forward current density also helps in forming good contact between deposited copper and gold seed layer. In reverse pulse on period ($t_2$), reverse current of magnitude 41 removes copper from pre-deposited locations, thus making the metal distribution more uniform. As can be seen, the magnitude of the forward current 47 is lower than that of the reverse current 41. The combination of the forward current over $t_1$ and the reverse current over $t_2$ forms a pulse current cycle 42. As the electroplating process continues, in the subsequent pulse current cycle 44, the forward current density is increased gradually to a magnitude of 48 while reverse current density is reduced to a magnitude of 43. In a third pulse current cycle 46, the forward current density is further increased gradually to a magnitude of 49 while reverse current density is further reduced to a magnitude of 45. Subsequent pulse current cycles follow the trend where the forward pulse current density increases, and the reverse current pulse density decreases.

In the present method, as the corresponding forward and reverse pulse current densities (as generated by the applied pulse current cycles) increase, so to do the amounts of conductive material being deposited within the through-hole via. In this respect, the forward current density may vary between about 10 mA/cm$^2$-about 100 mA/cm$^2$ and the reverse current density may vary between about 60 mA/cm$^2$-about 300 mA/cm$^2$. In one exemplary embodiment of the present method, the forward current density generated is gradually increased in incremental steps (about 12, about 15, about 20 and about 30 mA/cm$^2$) while reverse current density is correspondingly reduced (about 60, about 50, about 45, and about 30 mA/cm$^2$).

In one embodiment of the method, the magnitude of the forward pulse current in each subsequent pulse cycle may be inversely correlated to the effective aspect ratio of the via, and the magnitude of the reverse pulse current in each subsequent pulse cycle may be directly correlated to the effective aspect ratio of the via.

In another embodiment of the method, the magnitude of the forward pulse current and the magnitude of the reverse pulse current, in each pulse current cycle, may be in a predetermined ratio with respect to each other. In such an embodiment, the predetermined ratio of the magnitude of the forward pulse current and the magnitude of the reverse pulse current tends to unity over each subsequent pulse current cycle.

In this present method, the period during which the forward pulse current supplied is always greater than the period for which the reverse pulse current is supplied. Typically, the predetermined time period for which the forward pulse current is supplied may range between about 20-about 40 milliseconds (ms) while that of the reverse pulse current may range between about 0.1-about 1.0 milliseconds (ms), for example.

Alternatively, the pulse 'on' time for the forward pulse current may not necessarily be constant over each and every subsequent pulse current cycle. In this respect, the pulse 'on' time may be reduced from about 4.0 ms to about 2.0 ms (also possibly in incremental steps), while the pulse 'on' time for the reverse pulse current may be kept constant at about 0.1 ms or increased to about 1.0 ms (also incrementally), for example.

Figure 5:
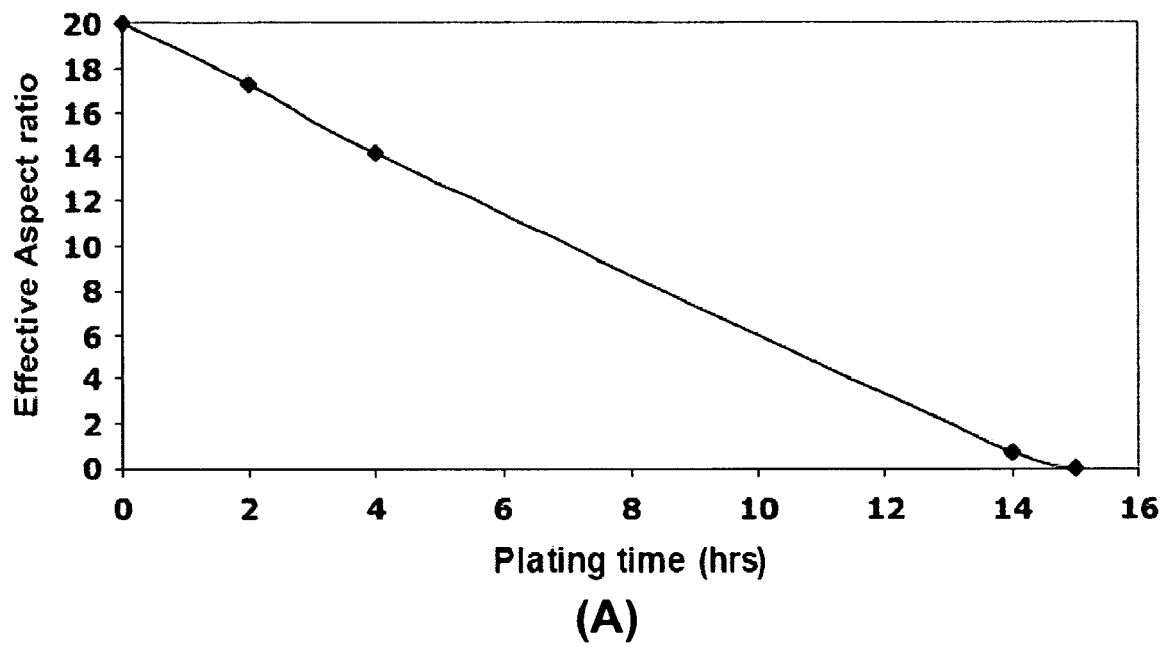
FIG. 5A is a graph of the variation of the effective aspect ratio over time.
FIG. 5B is a graph of the variation of the depth of the through-hole over time.
Figure 5:
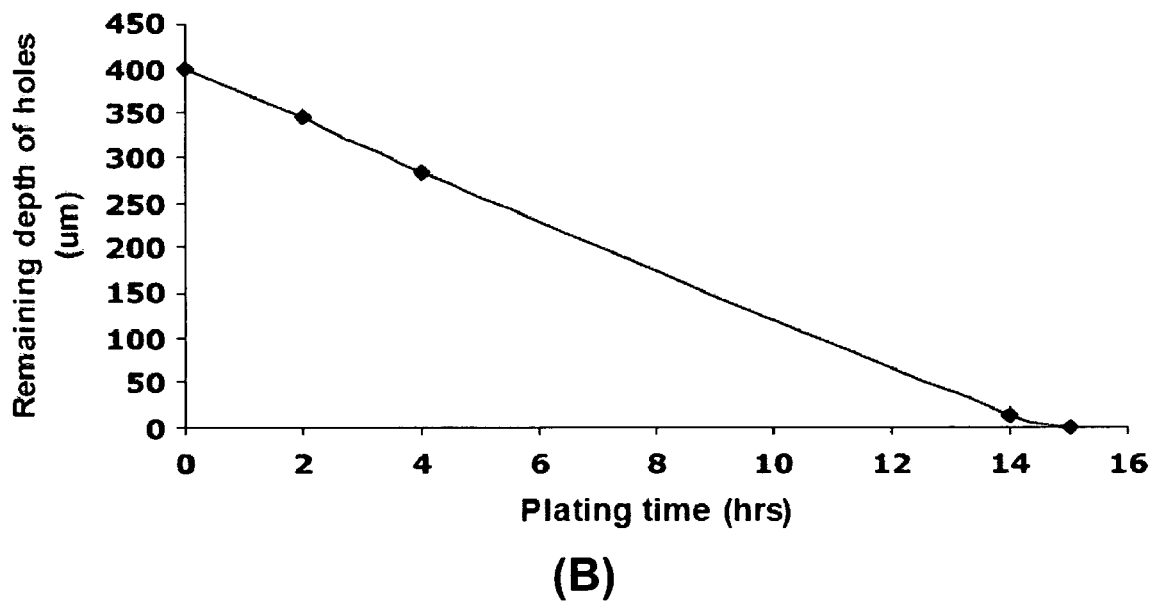

FIG. 5A is a graph of the variation of the effective aspect ratio over time, and FIG. 5B is a graph of the variation of the depth of the through-hole over time. In FIG. 5A, the effective aspect ratio (EAR) is initially at 20 (i.e. EAR=20) when the plating time, t, is zero (i.e. t=0 hours). As shown in the graph, the effective aspect ratio reduces almost linearly such that the EAR=0 when t=15 hours. FIG. 5B has the depth at 400 μm initially. As in the EAR, the depth also decreases linearly over time till the via is filled (i.e. depth=0) at t=15 hours.

Figure 6:
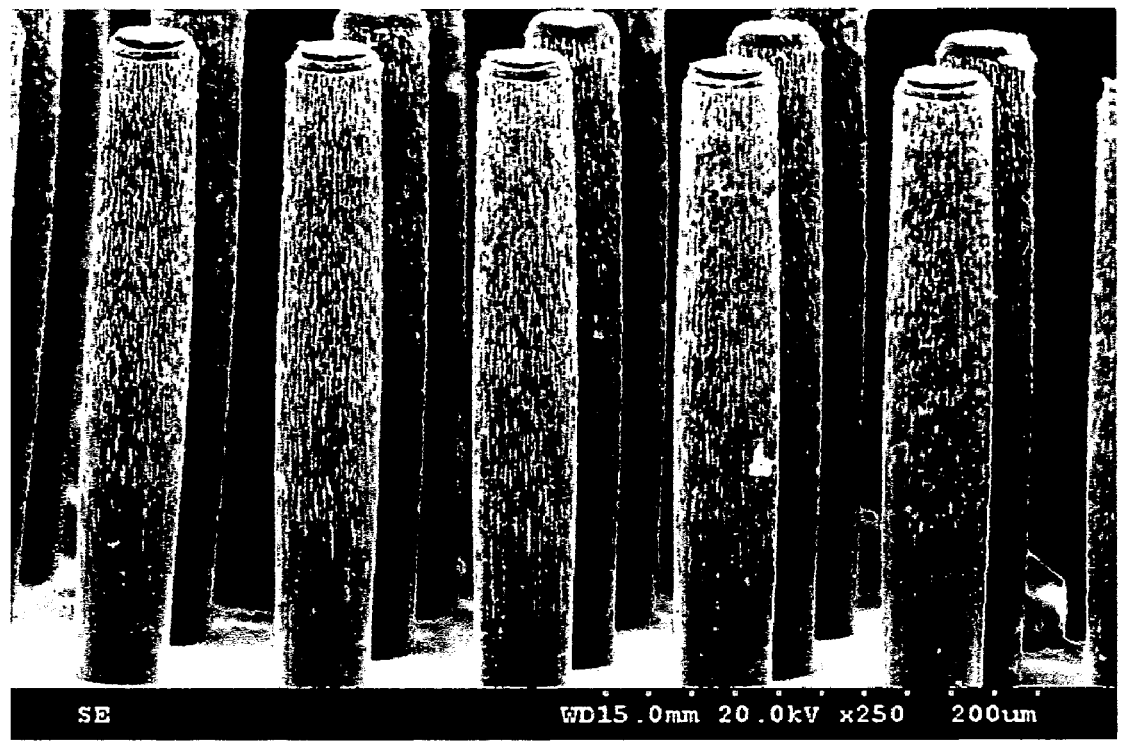
FIG. 6A and FIG. 6B are SEM images of electroplated through-wafer copper interconnects fabricated by 'aspect ratio dependent electroplating' using reverse pulse electroplating.
Figure 6:

FIGS. 6A and 6B show SEM images of resulting copper interconnects formed by the application of the EAR dependent electroplating method described above. From the SEM images, the respective interconnects appear to have a very uniform copper deposition along its length.

Figure 8:
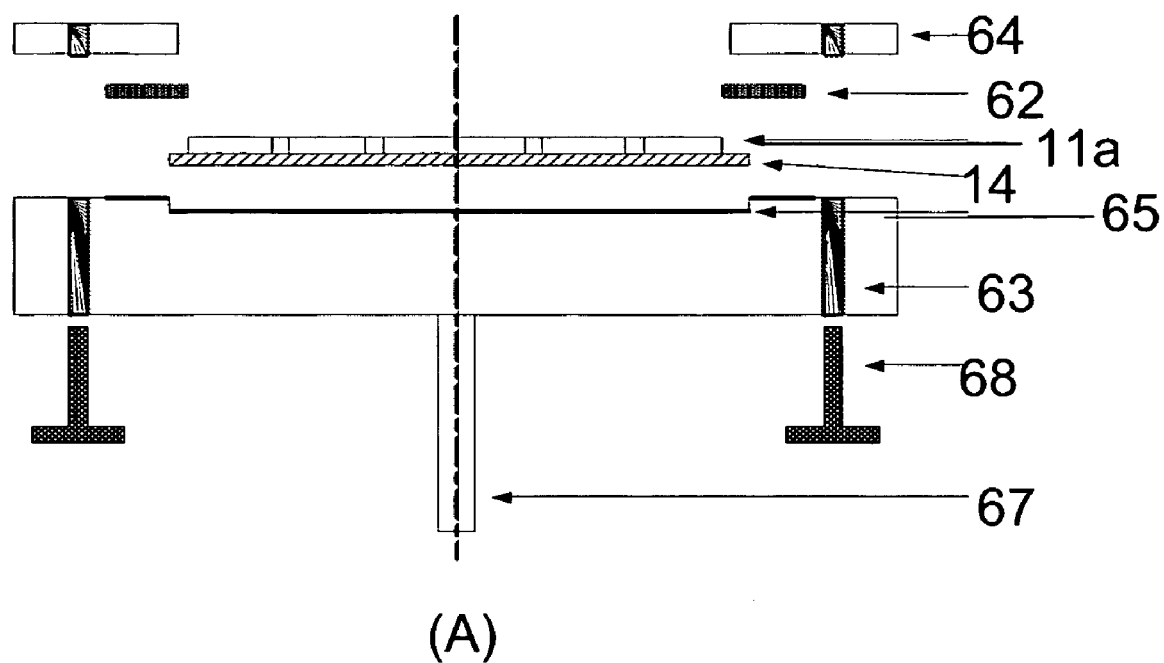
FIG. 8A illustrates a exploded schematic representation of a wafer holder used in electroplating.
FIG. 8B is an assembled view of the wafer holder.
Figure 8:
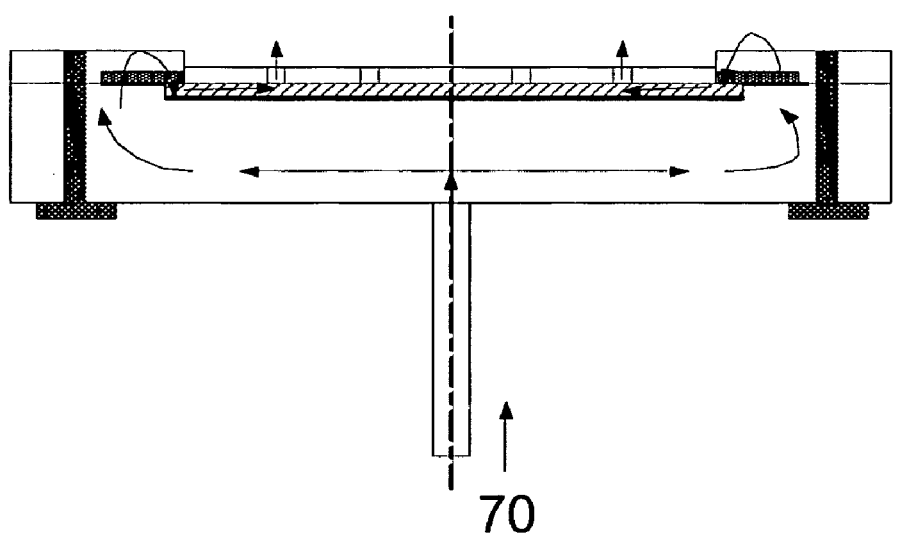

A second aspect of the present invention relates to a wafer holder device illustrated in FIGS. 8A (exploded view), 8B and 9. The wafer holder device is for holding a support wafer (such as 14) having a circular device wafer (such as 11a) mounted thereon. This device is used during the electrodeposition of a conductive material into at least one through-hole via of said device wafer 11a. In using this device, the device wafer 11a is required to be of a smaller diameter than its support wafer 14 and is mounted on said support wafer 14 in a concentric arrangement leaving an open ring portion surrounding said device wafer. It should be noted that the open ring portion may be of any shape and not restricted to just being circular since it results from the mounting of the device wafer on the support wafer. Accordingly, the shape of the open ring depends largely on the shape of the support wafer. It should also be noted that the support wafer essentially provides mechanical support and electrical connectivity to the device wafer 11a, and may also be known as a contact wafer. Accordingly, the term 'support wafer' and 'contact wafer' may be used interchangeably.

The wafer holder device includes a bottom portion 63 having a recess 65. The recess 65 is adapted to accommodate therein the support wafer 14 such that the support wafer 14 contacts the bottom and occupies the recess while the device wafer 11a protrudes from the opening of said recess. The bottom portion 63 and recess 65 are in electrical connection with an electrical source (66 of FIG. 7).

The wafer holder device also includes a conducting contact ring 62 mounted to overlap the bottom portion 63 partially and the open ring portion of the support wafer partially, such that the annular ring 62 surrounds and contacts the circumferential periphery of the device wafer 11a. In addition, the wafer holder also includes an upper portion 64 adapted to be mounted on said bottom portion 63 such that it sandwiches therebetween said conducting ring 62 and support wafer 14. This ensures that an electrical connection exists between said electrical source 66 and the device wafer 11a via the bottom portion 63, annular ring 62 and support wafer 14. The upper portion 64 is secured to the bottom portion 63 by securing means such as clamps or screws 68, for example.

The wafer holder device ensures that the current supplied via a conducting rod 67, is distributed across the device wafer 11a evenly. This is shown in FIG. 8B, where the path of the current within the assembled wafer holder device flows through the bottom portion 63, through the conducting ring 62, which contacts the support wafer 14 and the seed layer on said support wafer 14.

Figure 9:
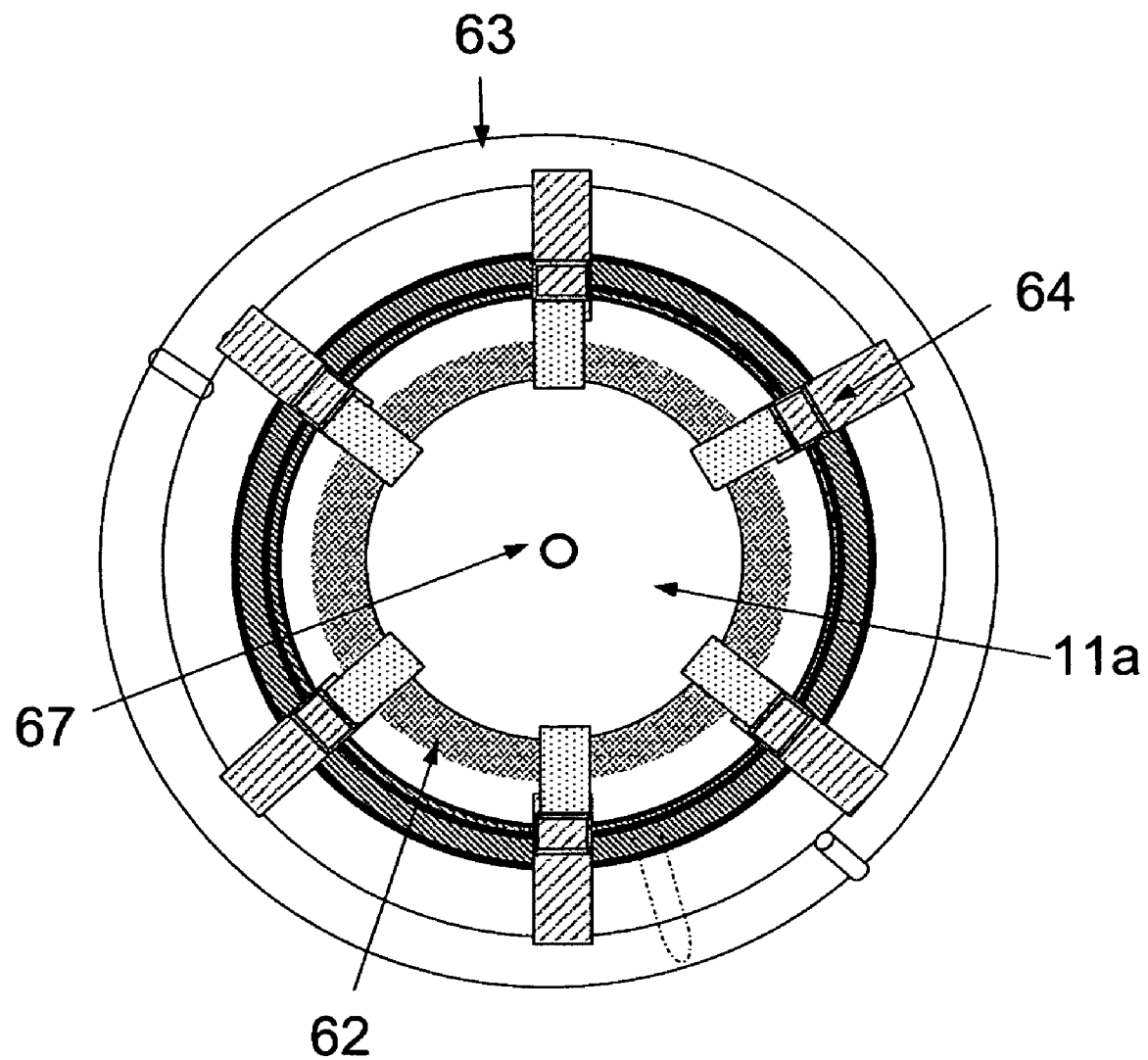
FIG. 9 is a top view of the wafer holder of FIG. 8A and FIG. 8B.

FIG. 9 is a top view of the wafer holder of FIG. 8A and FIG. 8B. As shown, the support wafer 14 (not shown) and device wafer 11a thereon are clamped between the bottom portion 63 and the upper portion 64. The connecting rod 67 provides an electrical connection between the bottom portion and the respective wafers 14 and 11a. In this embodiment of the wafer holder device, the conducting ring is an annular ring as the support wafer 14 and bottom portion 63 are also circular. However, the conducting ring need only be circular so far as to surround and contact the periphery of the device wafer 11a. The rest of the conducting ring may be of any other shape suited to contact the bottom portion 63 and support wafer 14 in an overlapping manner, for example.

Figure 7:
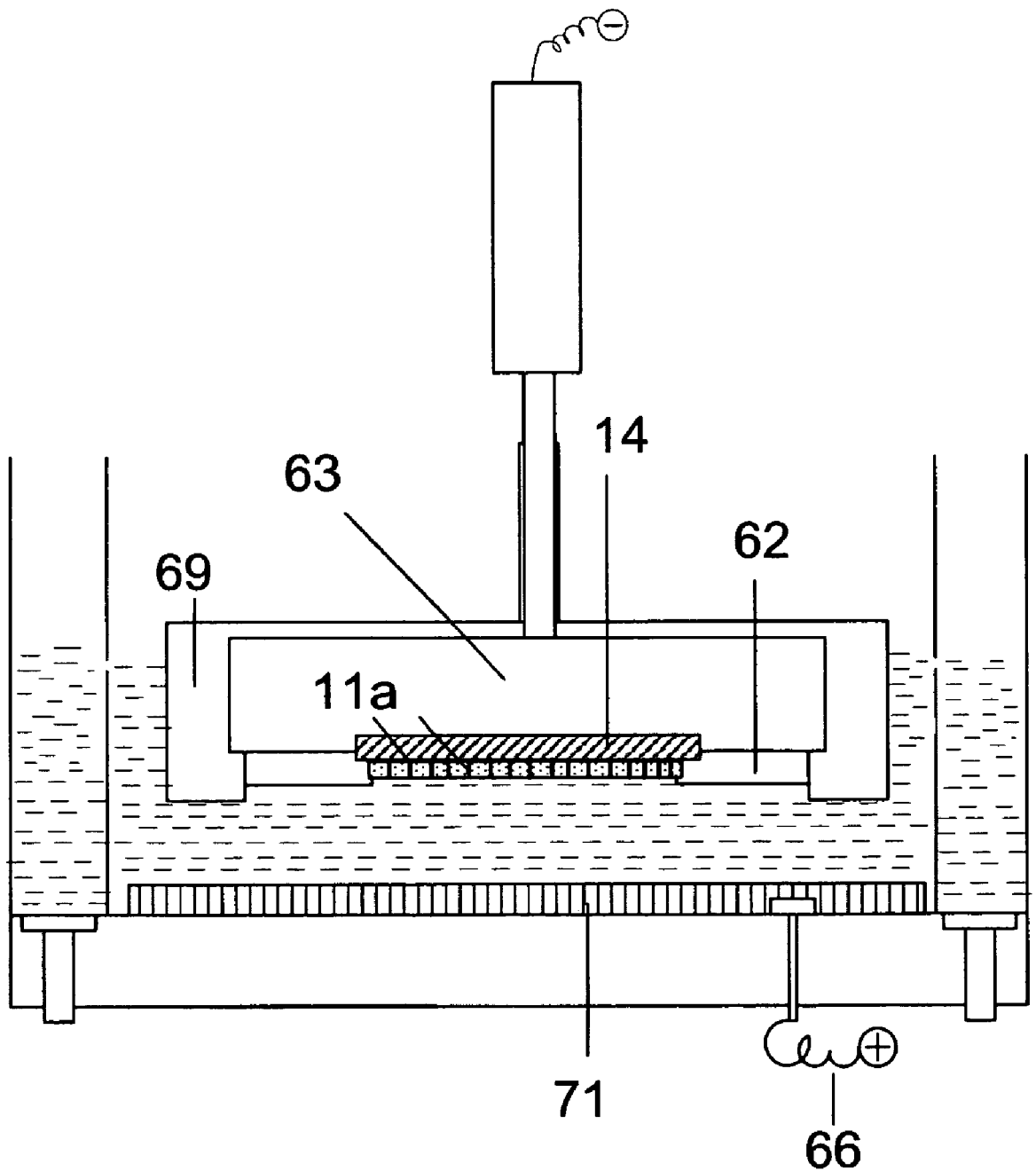
FIG. 7 illustrates a schematic representation of an electroplating setup.

The wafer holder device described above, when used in electroplating, differs from the conventional 'cathode on bottom' electroplating setup where the cathode (wafer holder) is typically placed at the bottom. In an exemplary electroplating setup, described here and as shown in FIG. 7, an anode (copper plate) 71 is placed at the bottom and the wafer holder device is arranged above (distally opposite) the anode 71. Copper electrolyte is then pumped symmetrically against the wafer holder in the form of a stagnant flow.

In the above electroplating setup a simple mechanism of rack and pinion (not shown) may be included to vary the inter-electrode gap between the wafer holder and the copper plate 71. The outer surface of the wafer holder is typically coated with an insulating material such as a dielectric polymeric material, for example. Specific examples of dielectric polymeric materials include, but are not limited to, any dielectric polymeric material selected from the group consisting of thermoplastic acrylites, silicone, polyurethane fluorosilicone, fluoroelastomer, natural rubber, polybutadiene, nitrile rubber, isoprene, polytetrafluoroethylene (PTFE) and polyimides. The insulating material is applied over the outer surface of wafer holder to isolate the wafer surface and to minimize the current loss.

The recess 65 of the bottom portion 63, conducting annular ring 62 and support wafer (where said support wafer is not a contact wafer) 14 may be formed from a conducting material such as a metal. Examples of a metal that may be used include, but are not limited to, any metal selected from the group consisting of gold, copper, silver and nickel.

In addition, the electrical source 66 of the setup of FIG. 7 may be supplemented with a pulse rectifier capable of supplying continuous and pulse waveforms of varying current densities and varying 'on and ' off periods. Such a pulse rectifier may be capable of supplying a current of up to about 100 ampere and has a cycle time of up to 99999 seconds, for example.

Another aspect of the present invention relates to a method of preparing a device wafer 11a for electro-deposition using a wafer holder device as described above. This method is used in relation to device wafer 11a which has a diameter that is less than the diameter of its associated support wafer. The device wafer 11a of reduced diameter may be achieved by etching away a uniform circumferential portion of said device wafer 11a, for example.

The method includes:
coating the support wafer with an adhesion and a seed layer;
etching holes of a predetermined depth in the device wafer;
bonding the device wafer to the support wafer in a concentric arrangement; and
mounting the support wafer, with the device wafer bonded thereto, in the recess of the bottom portion of the wafer holder device and securing the device wafer in position.

EXPERIMENTAL DATA (I) Processes for Improvement in the Wettability of Silicon-Based Material Used in High Aspect Ratio Through-Via Copper Electroplating Before the electroplating process, the wettability of silicon-based device wafers was investigated as follows:

Sample Preparation

The samples chosen in this investigation were prepared from p-type, (100) oriented silicon wafer having an electrical resistivity of 1-10 $\mu\Omega$-cm. Samples investigated include DRIE etched silicon sample (DRIE-Si), DRIE-Si with thermally oxidized $SiO_2$ (DRIE-Si—$SiO_2$), DRIE-Si with $SiO_2$ and $Si_3N_4$ (DRIE-Si—$SiO_2$—$Si_3N_4$), native silicon coated with polymer using $C_4F_8$ gas in DRIE system, and phosphorosilicate glass (PSG). Process parameters of the DRIE recipe for etching the silicon samples are given in Table 2 as: $SF_6$ flow rate—120 sccm, $C_4F_8$ flow rate—85 sccm, platen power—14 W, coil power—600 W, and etch/passivation cycle time—12/7 sec.

Contact Angle Measurement by Sessile Drop Method

Contact angle measurements were performed with a contact angle analyzer (SEO 300A by surface Electro Optics Corporation Ltd., Korea) using sessile drop method. De-ionized (DI) water and copper electrolyte (provided by Atotech, Germany) were used for the measurement. The copper electrolyte consists of three main components: base solution containing copper sulphate, sulfuric and hydrochloric acid and organic additives i.e. brightener and leveller. The copper sulphate solution provides the cupric ions, which are deposited at the cathode surface during the copper electrodeposition process. The brightener and leveller are the organic additives, which improves the super filling characteristics and the surface finish of electroplated copper.

The samples were placed on a horizontal stage and a 5 $\mu$l liquid droplet was formed at the tip of the syringe and the specimen was raised until it touches the bottom of the drop. The image of the liquid drop-solid surface interface was captured using a CCD camera. The contact angle of the liquid droplets on the substrates was measured by fitting a mathematical expression to the shape of the droplet. All measurements were carried out at 25° C. and a relative humidity of 54%.

Experimental Results

Wetting of DRIE Etched Silicon Samples with Silicon Oxide and $Si_3N_4$ (DRIE-Si—$SiO_2$—$Si_3N_4$)

In most cases of the copper electroplating applications, an insulation layer is deposited between silicon and electroplated copper, to prevent the diffusion of copper in silicon. Silicon oxide is widely used as the insulation layer. In order to simulate the wetting properties of DRIE vias for copper electroplating, a 1.8 $\mu$m thick layer of silicon oxide was grown on DRIE etched silicon samples (etched for 30 min using DRIE standard protocol) by wet oxidation. The contact angle measurements were carried out on these DRIE etched silicon samples with thermally oxidized silicon (DRIE-Si—$SiO_2$). Table 1 summarizes the measured contact angle results.

As shown in Table 1, DRIE-Si—$SiO_2$ had shown poor wettability with copper electrolyte, while $Si_3N_4$ had shown better wettability (contact angle ~31°). In order to increase the wettability of the insulating layer, a low stress $Si_3N_4$ film was deposited on the DRIE-Si—$SiO_2$. Low stress $Si_3N_4$ of about 200 nm thicknesses was deposited by LPCVD (using a gas mixture of silane ($SiH_4$) and ammonia ($NH_3$) in the ratio 6:1 at 835° C.). The contact angle measurements were again performed on these samples (DRIE-Si—$SiO_2$—$Si_3N_4$) and the obtained results are given in Table 1. It is clearly shown that the contact angle of these samples (DRIE-Si—$SiO_2$—$Si_3N_4$) is lower than that of DRIE-Si—$SiO_2$ sample with copper electrolyte. In order to improve the wettability further, the DRIE-Si—$SiO_2$—$Si_3N_4$ samples were treated in SC1 at 75° C. for 30 min, followed by DI water rinsing and completely dried by dry nitrogen.

Figure 10:
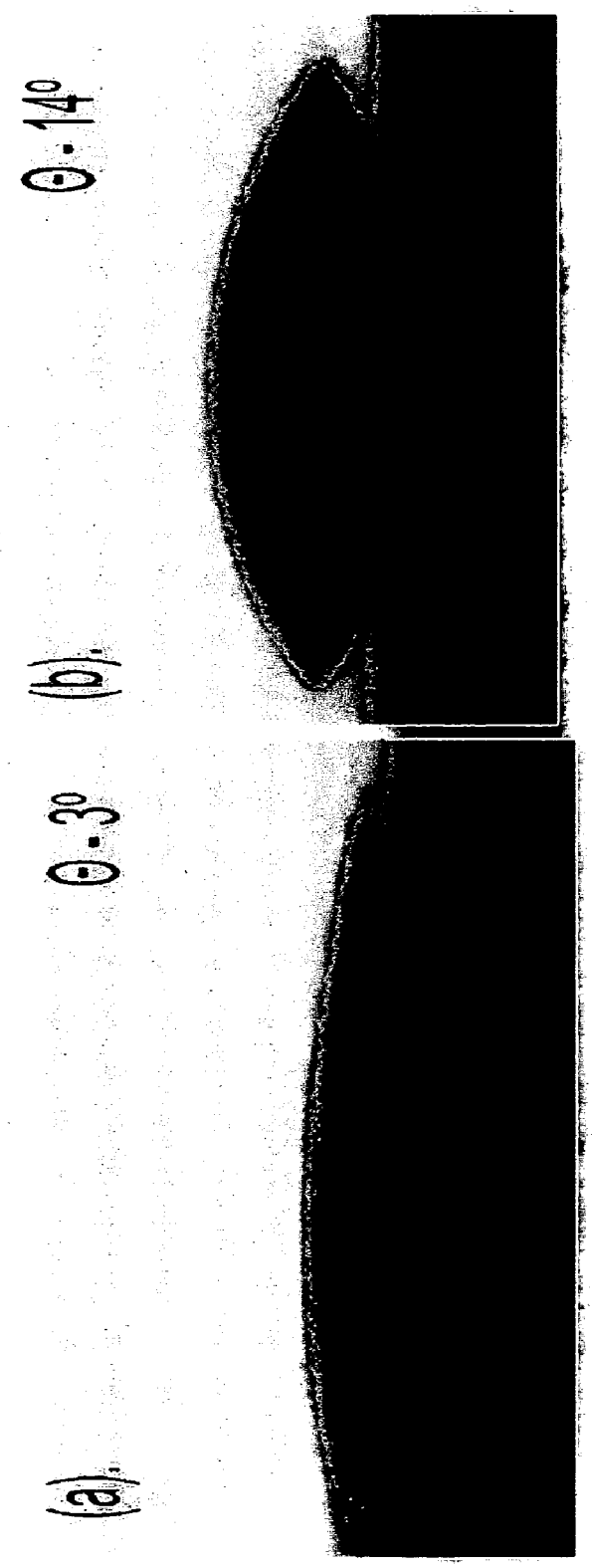
FIG. 10 shows the microscopic images of samples after SC1 treatment.

After the SC1 treatment, DRIE-Si—$SiO_2$—$Si_3N_4$ samples have shown significant improvement in the wetting characteristics with the copper electrolyte. FIG. 10 shows the microscopic images of the samples after SC1 treatment. The contact angle value with copper electrolyte with SC1 treated DRIE-Si—$SiO_2$—$Si_3N_4$ sample was found to be as low as 3° (a), which makes it more hydrophilic than the native silicon with copper electrolyte. This enhanced wettability is due to the increased number of adsorbed hydrophilic polar functional groups (—NH$_2$) on the DRIE-nitride samples after the surface treatment by SC1 solution. Ammonium hydroxide present in the SC1 solution provides these polar functional groups (—NH$_2$), which help in hydrogen bonding with the copper electrolyte.

Conclusion

From above experiments, it was concluded that that the wetting characteristics of commonly used materials such as silicon oxide and silicon nitride can be improved by pre-treating the samples in SC1, (a mixture of 30% H$_2$O$_2$, 25% NH$_4$OH and de-ionised water in the ratio 1:1:5), at 75° C. for about 10-30 min. It was also concluded that silicon nitride surface treated in SC1 provides the most suitable wetting surface from the point of view of electroplating.

Hence, a combination of coating a layer of silicon nitride followed by SC1 surface treatment gives the most hydrophilic surface to a device wafer having through-hole vias when used in conjunction with a copper electrolyte.

TABLE 1

Contact angle measurement results of DRIE etched silicon samples with thermally grown silicon oxide, with LPCVD grown silicon nitride and after SC1 treatment

| Sample | Surface modification | Contact angle with DI water | Contact angle with the electrolyte |
|---|---|---|---|
| Thermally grown silicon oxide on DRIE etched silicon samples oxidation (DRIE-Si—SiO$_2$) | | | |
| DRIE-Si—SiO$_2$ | Thermal oxidation (1.8 μm thick oxide film) | 55° | 59° |
| LPCVD silicon nitride deposition on DRIE-Si—SiO$_2$ sample (DRIE-Si—SiO$_2$—Si$_3$N$_4$) | | | |
| DRIE-Si—SiO$_2$—Si$_3$N$_4$ | Si$_3$N$_4$ on the oxide (200 nm thick nitride) | 26° | 31° |
| DRIE-Si—SiO$_2$—Si$_3$N$_4$ after SC1 treatment | | | |
| DRIE-Si—SiO$_2$—Si$_3$N$_4$ | Treated in SC1 at 75° C. for 30 min followed by DI water rinse and blown dry using nitrogen | 3-4° | 3° |

TABLE 2

DRIE process parameters used in high aspect ratio through-hole etching

| Parameters | Value |
|---|---|
| SF$_6$ flow rate | 120 sccm |
| C$_4$F$_8$ flow rate | 85 sccm |
| O$_2$ flow rate | 14 sccm |
| Etch time | 12 sec |
| Passivation time | 7 sec |
| Coil power | 600 W |
| Platen power | 16 W |
| APC | 75% |

(II) Aspect Ratio Dependent Copper Electrodeposition Technique for Very High Aspect Ratio Through-Hole Plating A new scheme/method of electroplating is used to deposit copper uniformly in very high aspect ratio through-holes. A simple rule-of-thumb—'the higher the aspect ratio, the lower is the forward current density and the higher the reverse current density' to be supplied forms the foundation of this technique. This method considers the unfilled depth of through-holes or 'effective aspect ratio' as main criteria to decide the electroplating current parameters. 'Effective aspect ratio' is termed as the ratio of 'unfilled depth of through-holes' to the opening size of through-via, as previously defined and explained.

Figure 11:
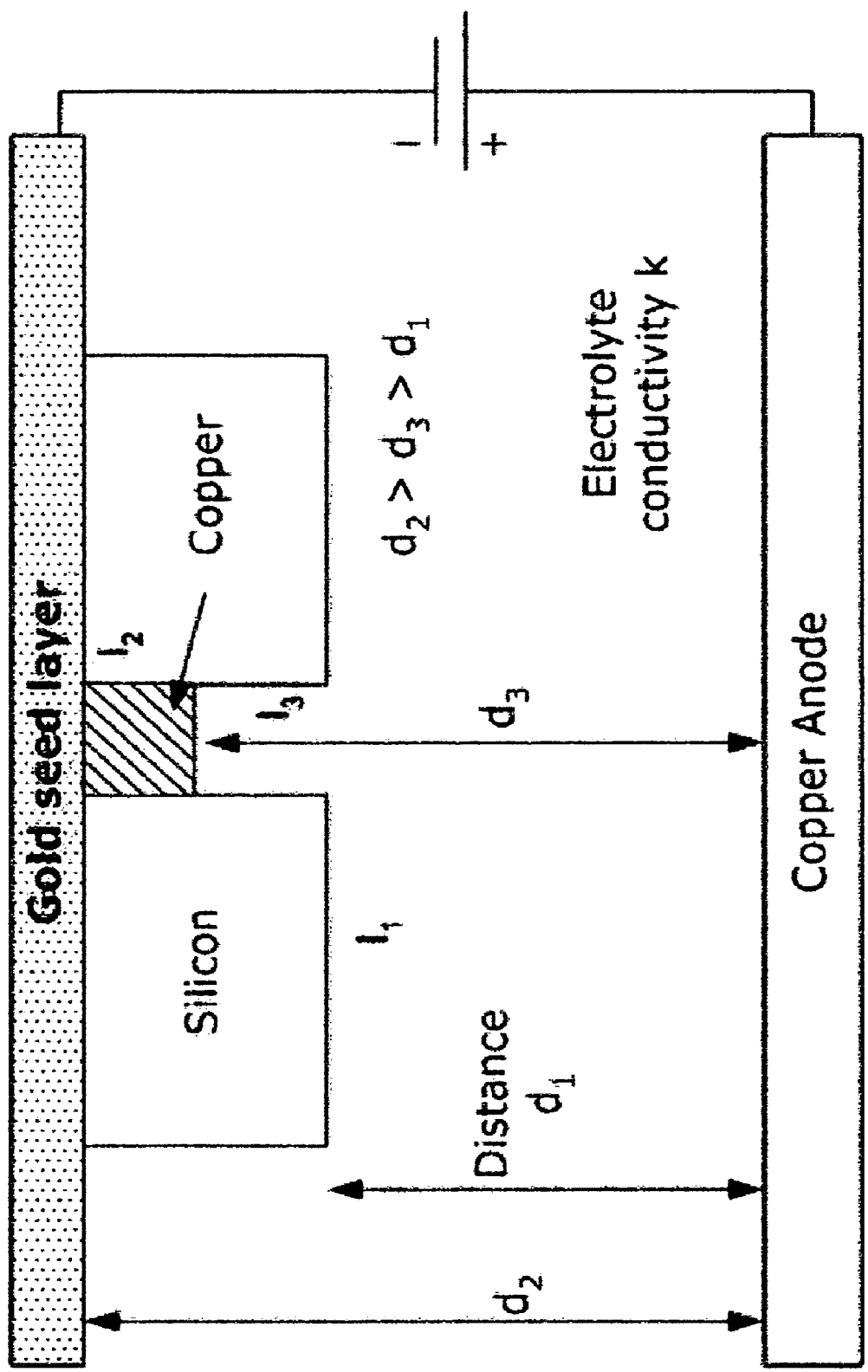
FIG. 11 shows a schematic diagram showing dependence of primary and secondary current on electrode path length.

As the effective unfilled depth is continuously reducing, electrolyte kinetics and cupric ion mass transfer does not remain uniform. As shown in FIG. 11, primary current distribution which is a result of ohmic potential drop through the electrolyte is strictly a function of electrolyte path length i.e. the depth of through-holes which electrolyte will travel. Primary current distribution at the opening of through-holes ($I_1$) and at the bottom of through-holes ($I_2$) can be expressed as:

$$\frac{I_1}{I_2} = \frac{d_2}{d_1} \tag{1}$$

Similarly secondary current distribution which is due to the various polarization effect can be expressed by the following equation:

$$\frac{I_1}{I_2} = \left[\frac{d_2 + k\frac{dE}{dI}}{d_1 + k\frac{dE}{dI}}\right] \tag{2}$$

where k is the electrolyte conductivity.

As a result of the variation in distance between the deposited metal and the anode [due to the ever-changing effective aspect ratio (EAR)], given by $d_3$, (where $d_1 \leq d_3 \leq d_2$), the current distribution inside the deep through-hole also becomes non uniform. Uneven uniformity in current distribution and mass transfer of cupric ion affects the uniformity of copper deposition, which results in void formation, incomplete filling, rough grain formations and other undesired results as described earlier and as illustrated in FIG. 2B. However, conventional electroplating techniques do not consider the EAR and simply maintain the supplied current and preserve the uneven current density distribution across the through-hole via thereby still leading to the formation of voids during the electroplating process.

To maintain the uniform current distribution when the distance between anode and deposited metal ($d_3$) is continuously reducing, process parameters such as current density and pulse on time, should be varied as per changing unfilled depth (or EAR). This has been implemented in the 'aspect ratio dependent electroplating' experiment described here. The variation of current density distribution over time for this experiment is given in FIG. 4.

In this respect, the relationship between the effective aspect ratio (EAR), aspect ratio (AR) and forward and reverse pulse currents ($I_1$ and $I_2$ respectively) is derived as follows using copper as an illustrative example of the metal to be deposited:

Depth of through-holes to be electroplated is 'H' while its opening size is 'a'. Total number of such through-holes is 'N'. Copper density is $\rho$, and its atomic weight is $A_w$, Current efficiency of the electroplating process is $\eta$, and the Faraday constant is F (96500 coulombs).

$$\text{Total plating area, } A_p = N\pi a^2/4 \quad (i)$$

A rectangular pulse wave form is used for electroplating process. Magnitude of current in the forward direction is $I_1$ and in the reverse direction is $I_2$. Pulse 'on' time in the forward and reverse direction is $t_1$ and $t_2$ respectively. At the beginning of the electroplating process ($\tau$=0), the height of electroplated copper will be 0. Thus, $$\text{Aspect Ratio (AR) of through hole is given by } AR = H/a \quad (ii)$$

As the electroplating process goes on ($\tau$>0), copper starts depositing on the bottom of the seed layer and thus the height of the electroplated copper starts increasing (h>0). Assuming that after $\tau$ electroplating time, the height of the electroplated copper deposited on the bottom of seed layer is 'h'. Hence, the effective aspect ratio (EAR) of the through-holes will be, $$\text{Effective aspect ratio of through hole, } EAR = (H-h)/a \quad (iii)$$

If the total amount of copper deposited in the through-holes is R, then it can be expressed by the following Faraday's equation:

$$\text{Amount of copper deposited } R = \eta z(I_1 t_1 - I_2 t_2)/F \quad (iv),$$

where z is the chemical equivalent weight of copper, a ratio of the atomic weight of copper to the number of electrons transferred in the electroplating process. Thus, equation (iv) can be rearranged as:

$$\text{Amount of copper deposited } R = \eta A_w(I_1 t_1 - I_2 t_2)/nF \quad (v)$$

$$\text{Volume of copper deposited } V = \eta A_w(I_1 t_1 - I_2 t_2)/\rho nF \quad (vi)$$

The height of electroplated copper can be found out by dividing the volume (equation. vi) by total plating area (equation i). Hence, height of electroplated copper in through holes after $\tau$ electroplating time is given by:

$$h = \eta A_w(I_1 t_1 - I_2 t_2)/\rho nF A_p$$

$$h = 4\eta A_w(I_1 t_1 - I_2 t_2)/\rho nF N\pi a^2 \quad (vii)$$

In the above equation (vii), $\eta$, Aw, $\rho$, n, $\pi$ and F are constant, and can be replaced by some other constant such as 'K', where $K = 4\eta A_w/\rho nFN\pi$. In doing so, equation (vii) can be rearranged as $$h = K(I_1 t_1 - I_2 t_2)/a^2$$

Putting the above value of 'h' in equation (iii), $EAR = [H - K(I_1 t_1 - I_2 t_2)/a^2]/a$, which simplifies to $$EAR = AR - \frac{K}{a^3}(I_1 t_1 - I_2 t_2), \quad (viii)$$

where $$K = \frac{4A_w \eta}{\pi \rho nF \cdot N}$$

and is a constant.

The above equation is a simple relationship between the major parameters of aspect ratio dependent electroplating. Based on the above relationship, the magnitude of the forward pulse current and the reverse pulse current can be determined in relation to the EAR.

Wafer Sample Preparation Steps

Schematic fabrication process flow diagram of through-wafer copper interconnects is illustrated in FIG. 1. Through-holes of varying opening sizes and depths were electroplated using the aspect ratio dependent electroplating method. Instead of a conventional plating technique, where a seed layer is deposited on the side walls of through-holes, a 'bottom-up' electroplating technique was used. Bottom-up electroplating approach utilizes two wafers that are termed as device wafer and contact (or support) wafer. The device wafer has through-holes in which the interconnects are to be formed by electroplating.

In the experiments, electrical contact is provided through a 300 nm thick seed layer that was deposited on the contact wafer by a sputtering process. Gold was preferred over other conductive metals due to its superior electrical conductivity and excellent oxidation resistance. Through holes of varying dimensions from 20 μm to 40 μm were etched by DRIE-BOSCH process. Table 2 above shows the DRIE process parameters used in the high aspect ratio through-hole etching. After making through-holes, thin layer of $SiO_2$ and $Si_3N_4$ were deposited. The device and contact wafers were temporarily bonded by photoresist.

Experimental Results

DRIE Etched Through-Holes

Through-holes of varying opening size from 20 μm to 40 μm were etched in the device wafer by DRIE process. A 1.8-μm thick $SiO_2$ layer was used as a mask layer along with 5 μm AZ9260 photoresist. Thickness of device wafers used between about 200 μm to about 400 μm; hence, the DRIE etched through-holes had aspect ratios that varied from 5 to 15. The etch rate was found to be varying for different via opening size. After 30 min of etching, the etch rate for 20 μm diameter was 2.5 μm/min, while for 50 μm diameter, it was 3.6 μm/min. After 150 min of etching, the etch rate reduced to 1.6 μm/min and 1.8 μm/min respectively.

Figure 12:
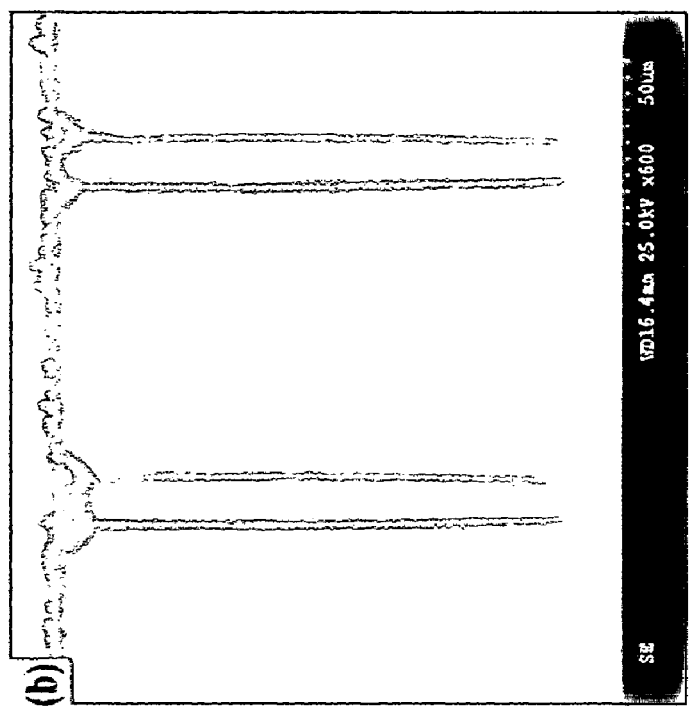
FIG. 12 shows the cross sectional image of DRIE etched through-holes.
Figure 12:
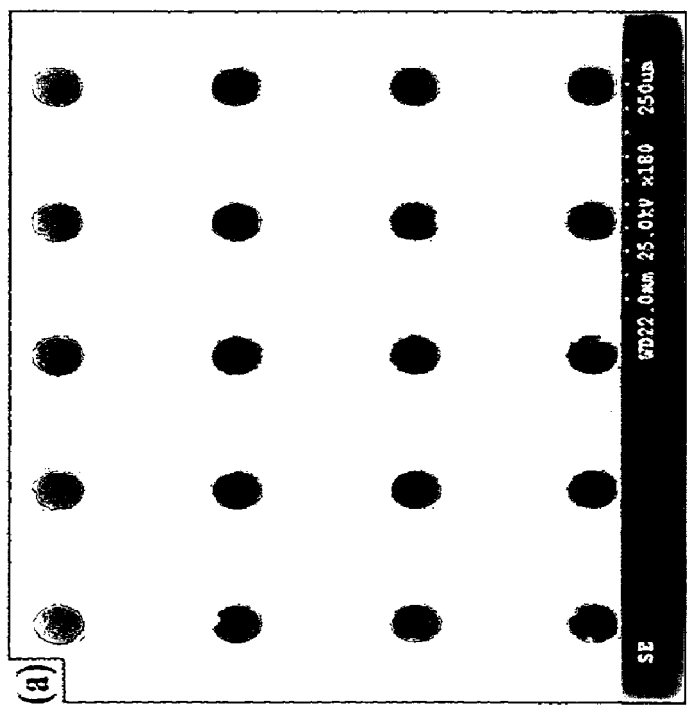

The varying etch rates, in the case of small diameter through-holes, is due to the fact that less fluoride ions are available for reaction with silicon than large diameter through-holes. Due to decreased availability of fluoride ions, the possibility of silicon etching minimizes and thus, the etch rate reduces over time for small through-holes. The main reason for the deceleration of silicon etching in high aspect ratio through-holes appears to be the loss of an etchant species due to the side wall reactions combined with feature closure by an ion-limited passivation polymer etching. FIG. 12 shows the cross sectional image of DRIE etched through-holes.

'Aspect Ratio Dependent Electroplating'

With reference to FIGS. 4 and 11, in the beginning of the electroplating process when the depth of through-holes is very high ($d_2$), a relatively low forward pulse current ($I_1$) with high reverse current density ($I_2$) is used so that copper grains can be deposited on the bottom without any voids. During the pulse 'on' time ($t_1$), current of low magnitude flows in a forward direction and fine grain copper is deposited on the bottom of through-holes. A low magnitude forward current also helps in forming good contact between the deposited copper and the gold seed layer. In reverse pulse on period ($t_2$), the reverse current removes copper from pre-deposited locations, thus making the metal distribution more uniform.

As the electroplating process continues, the magnitude of the forward current ($I_1$) is increased gradually while that of the reverse current ($I_2$) is reduced according to the relationship (viii). Brief details of process parameters used in proposed high aspect ratio through-hole copper electroplating technique are given in Table 3 below.

Figure 13:
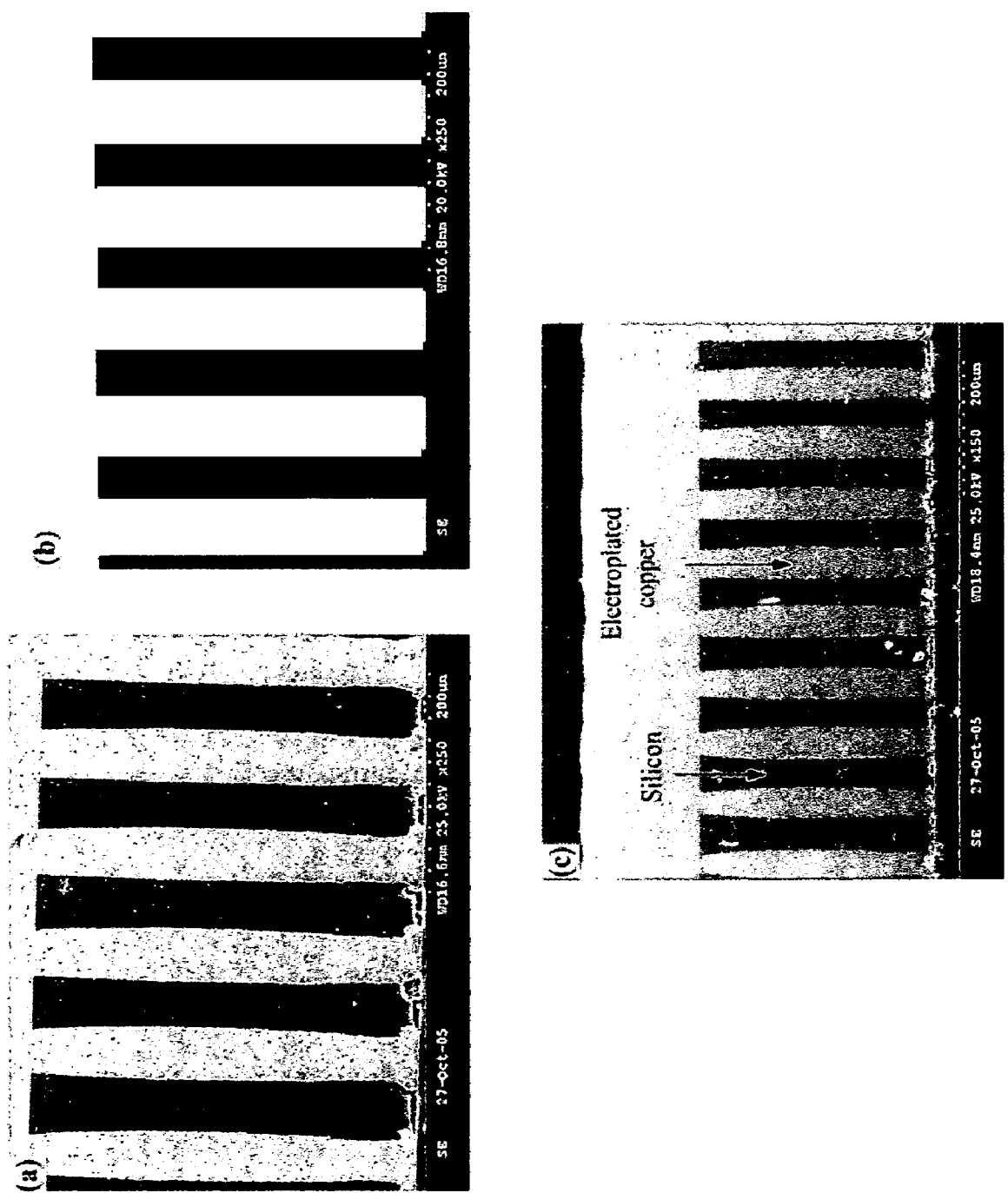
FIG. 13 shows the complete copper filling in high aspect ratio through-holes.

SEM images in FIG. 13 show the complete copper filling in high aspect ratio through-holes. Through-holes, having diameter 40 μm and depth 325 μm, are completely filled with copper without any void or defect. Copper growth is also very uniform along the depth.

TABLE 3

Process parameters of 'aspect ratio dependent electroplating' technique

| S. No. | No. of cycles | Forward current density (mA/cm$^2$) | Reverse current density (mA/cm$^2$) | Pulse on time (ms) | Pulse off time (ms) |
| --- | --- | --- | --- | --- | --- |
| 1 | 2 | 10 | 65 | 40 | 1 |
| 2 | 2 | 15 | 60 | 30 | 1 |
| 3 | 8 | 20 | 60 | 20 | 1 |
| 4 | 1 | 25 | 50 | 20 | 1 |
| 5 | 1 | 30 | 45 | 20 | 1 |

CONCLUSION

The 'aspect ratio dependent electroplating' method is used to solve the problem of void formation and incomplete filling of high aspect ratio through-holes. In this method, electroplating process parameters, such as current density and pulse on time, are continuously varied with electroplating process time. The quality of fabricated copper interconnects by this method has been shown to be superior over known techniques.

It is to be noted that the above description of the various exemplary embodiments of the present method only serves to aid in the better understanding of said method. As such, the present method is not be construed as being limited to the illustrated embodiments and its corresponding description, but, only as defined in the appended claims that follow.

What is claimed is:

1. A method of electro-depositing a conductive material in at least one through-hole via of a semiconductor substrate, said through-hole via having an effective aspect ratio, said method comprising:
  supplying an initial pulse current cycle to the via, said pulse current cycle comprising:
    a forward pulse current, and
    a reverse pulse current,
    wherein the forward pulse current and the reverse pulse current are each of a predetermined distinct magnitude and are each supplied over a predetermined distinct period, wherein the magnitude of the forward pulse current is lower than the magnitude of the reverse pulse current, such that a corresponding forward and reverse pulse current density is generated across the via causing conductive material to be deposited within the via, thereby reducing the effective aspect ratio of said via;
  measuring a remaining unfilled depth of the via after the initial pulse current cycle to determine the reduced effective aspect ratio of the via;
  supplying a first subsequent pulse current cycle to the via wherein the magnitude of the forward and reverse pulse currents of the first subsequent pulse current cycle are varied in relation to the reduced effective aspect ratio;
  measuring the remaining unfilled depth of the via after the first subsequent pulse current cycle to determine the further reduced effective aspect ration of the via; and
  supplying a second subsequent pulse current cycle to the via, wherein the magnitude of the forward and reverse pulse currents of the second subsequent pulse current cycle are varied in relation to the further reduced effective aspect ratio.

2. The method of claim 1, wherein the magnitude of the forward pulse current in each subsequent pulse cycle is inversely correlated to the effective aspect ratio of the via, and the magnitude of the reverse pulse current in each subsequent pulse cycle is directly correlated related to the effective aspect ratio of the via.

3. The method of claim 1 or 2, wherein the magnitude of the forward pulse current and the magnitude of the reverse pulse current, in each pulse current cycle, are in a predetermined ratio with respect to each other.

4. The method of claim 3, wherein the predetermined ratio of the magnitude of the forward pulse current and the magnitude of the reverse pulse current tends to unity over each subsequent pulse current cycle.

5. The method of claim 1, wherein each subsequent corresponding forward and reverse current density causes a correspondingly increasing amount of conductive material to be deposited within the through-hole via.

6. The method of claim 5, wherein the forward current density is between about 10 mA/cm$^2$-about 100 mA/cm$^2$.

7. The method of claim 5, wherein the reverse current density is between about 60 mA/cm$^2$-about 300 mA/cm$^2$.

8. The method of claim 1, wherein the period of the forward pulse current is greater than the period of the reverse pulse current.

9. The method of claim 1, wherein the predetermined time period for the forward pulse current is between about 20-about 40 milliseconds (ms).

10. The method of claim 1, wherein the predetermined time period for the reverse pulse current is between about 0.1-about 1.0 milliseconds (ms).

11. The method of claim 1, further comprising:
  coating the surface of the through-hole via with a layer of silicon nitride ($Si_3N_4$) before supplying the initial pulse current cycle to improve the hydrophilicity of the through-hole via towards an electrolyte.

12. The method of claim 11, further comprising:
  carrying out surface treatment of the coated surface of the through-hole via to increase the hydrophilicity thereof.

13. The method of claim 12, wherein the surface treatment is selected from the group consisting of applying a surface treatment solution or plasma etching.

14. The method of claim 13, wherein the surface treatment solution is a standard clean 1 (SC1) solution applied for 30 minutes at a temperature of 75° C.

15. The method of claim 14, further comprising:
  rinsing with de-ionized (DI) water; and
  drying the treated through-hole via of the semi-conductor substrate in nitrogen.

* * * * *